United States Patent
Hsu et al.

(10) Patent No.: US 9,412,590 B1
(45) Date of Patent: Aug. 9, 2016

(54) MANUFACTURING METHOD OF OXIDE SEMICONDUCTOR DEVICE

(71) Applicant: UNITED MICROELECTRONICS CORP., Hsin-Chu (TW)

(72) Inventors: Chia-Fu Hsu, Tainan (TW); Chun-Yuan Wu, Yun-Lin County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/840,055

(22) Filed: Aug. 31, 2015

(51) Int. Cl.
| | |
|---|---|
| H01L 21/321 | (2006.01) |
| H01L 21/4763 | (2006.01) |
| H01L 21/02 | (2006.01) |
| H01L 29/66 | (2006.01) |
| H01L 21/28 | (2006.01) |
| H01L 21/283 | (2006.01) |

(52) U.S. Cl.
CPC .... *H01L 21/02614* (2013.01); *H01L 21/02057* (2013.01); *H01L 21/02472* (2013.01); *H01L 21/02565* (2013.01); *H01L 21/283* (2013.01); *H01L 21/28008* (2013.01); *H01L 29/66477* (2013.01)

(58) Field of Classification Search
None
See application file for complete search history.

(56) References Cited

U.S. PATENT DOCUMENTS

| | | | |
|---|---|---|---|
| 7,893,440 B2 | 2/2011 | Kwon | |
| 8,766,252 B2 | 7/2014 | Yamazaki | |
| 8,785,241 B2 | 7/2014 | Sasagawa | |
| 8,796,679 B2 | 8/2014 | Jeong | |
| 8,945,981 B2 | 2/2015 | Yamazaki | |
| 8,951,899 B2 | 2/2015 | Yamade | |
| 8,987,730 B2 | 3/2015 | Yamazaki | |
| 9,012,918 B2 | 4/2015 | Yamazaki | |
| 9,041,202 B2 | 5/2015 | Kimura | |
| 9,054,200 B2 | 6/2015 | Okazaki | |
| 2009/0134399 A1 | 5/2009 | Sakakura | |
| 2010/0032666 A1 | 2/2010 | Yamazaki | |
| 2013/0161610 A1* | 6/2013 | Yamazaki | H01L 29/7869 257/43 |
| 2014/0131715 A1 | 5/2014 | Liu | |
| 2014/0239291 A1 | 8/2014 | Son | |
| 2014/0264321 A1 | 9/2014 | Liang | |
| 2014/0377905 A1 | 12/2014 | Ning | |
| 2015/0179810 A1 | 6/2015 | Yamazaki | |

* cited by examiner

*Primary Examiner* — Pamela E Perkins
(74) *Attorney, Agent, or Firm* — Winston Hsu; Scott Margo

(57) ABSTRACT

A manufacturing method of an oxide semiconductor device includes the following steps. A barrier layer is formed on a substrate. An annealing process is performed after the step of forming the barrier layer. A first oxygen treatment is performed on the barrier layer after the annealing process for forming a first oxygen provider layer on the barrier layer. An oxide semiconductor layer is then formed on the first oxygen provider layer.

12 Claims, 9 Drawing Sheets

MANUFACTURING METHOD OF OXIDE SEMICONDUCTOR DEVICE

BACKGROUND OF THE INVENTION

1. Field of the Invention

The present invention relates to a manufacturing method of an oxide semiconductor device, and more particularly, to a manufacturing method including forming an oxide semiconductor layer on an oxygen provider layer.

2. Description of the Prior Art

Because of the properties of low leakage current and high mobility, oxide semiconductor materials such as indium gallium zinc oxide (IGZO) are applied in thin film transistors (TFTs) of display devices and field effect transistors (FETs) of integrated circuits. However, the material and electrical properties of the oxide semiconductor layer tend to be influenced easily by the environment and the manufacturing process conditions. For IGZO, oxygen conditions such as oxygen deficiency and excess oxygen in IGZO play a crucial role in formations of shallow donor states and sub gap trap states, which largely affect the device characteristics. For example, if there are too many oxygen vacancies in an IGZO layer while some of the oxygen in the IGZO layer diffuses outward, the conductivity of the IGZO layer is enhanced and the IGZO layer may be converted from a semiconductor material into a conductive material. Therefore, it is important to protect the oxide semiconductor material from ambient influence so as to improving the stability and reliability of the oxide semiconductor device.

SUMMARY OF THE INVENTION

It is one of the objectives of the present invention to provide a manufacturing method of an oxide semiconductor device. In the manufacturing method, a first oxygen provider layer is formed on a barrier layer by performing a first oxygen treatment on the barrier layer, and an oxide semiconductor layer is then formed on the first oxygen provider layer. The first oxygen provider layer can provide oxygen to the oxide semiconductor layer and keep the oxide semiconductor layer from being degraded by the ambient condition and subsequent processes. The stability and reliability of the oxide semiconductor device may be enhanced accordingly.

A manufacturing method of an oxide semiconductor device is provided in an embodiment of the present invention. The manufacturing method includes the following steps. A barrier layer is formed on a substrate. An annealing process is performed after the step of forming the barrier layer. A first oxygen treatment is performed on the barrier layer after the annealing process for forming a first oxygen provider layer on the barrier layer. An oxide semiconductor layer is then formed on the first oxygen provider layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-5 are schematic drawings illustrating the manufacturing method of the oxide semiconductor device according to the first embodiment of the present invention, wherein FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

FIG. 8 and FIG. 9 are schematic drawings illustrating the manufacturing method of the oxide semiconductor device according to the third embodiment of the present invention, wherein FIG. 9 is a schematic drawing in a step subsequent to FIG. 8.

DETAILED DESCRIPTION

Figure 1:
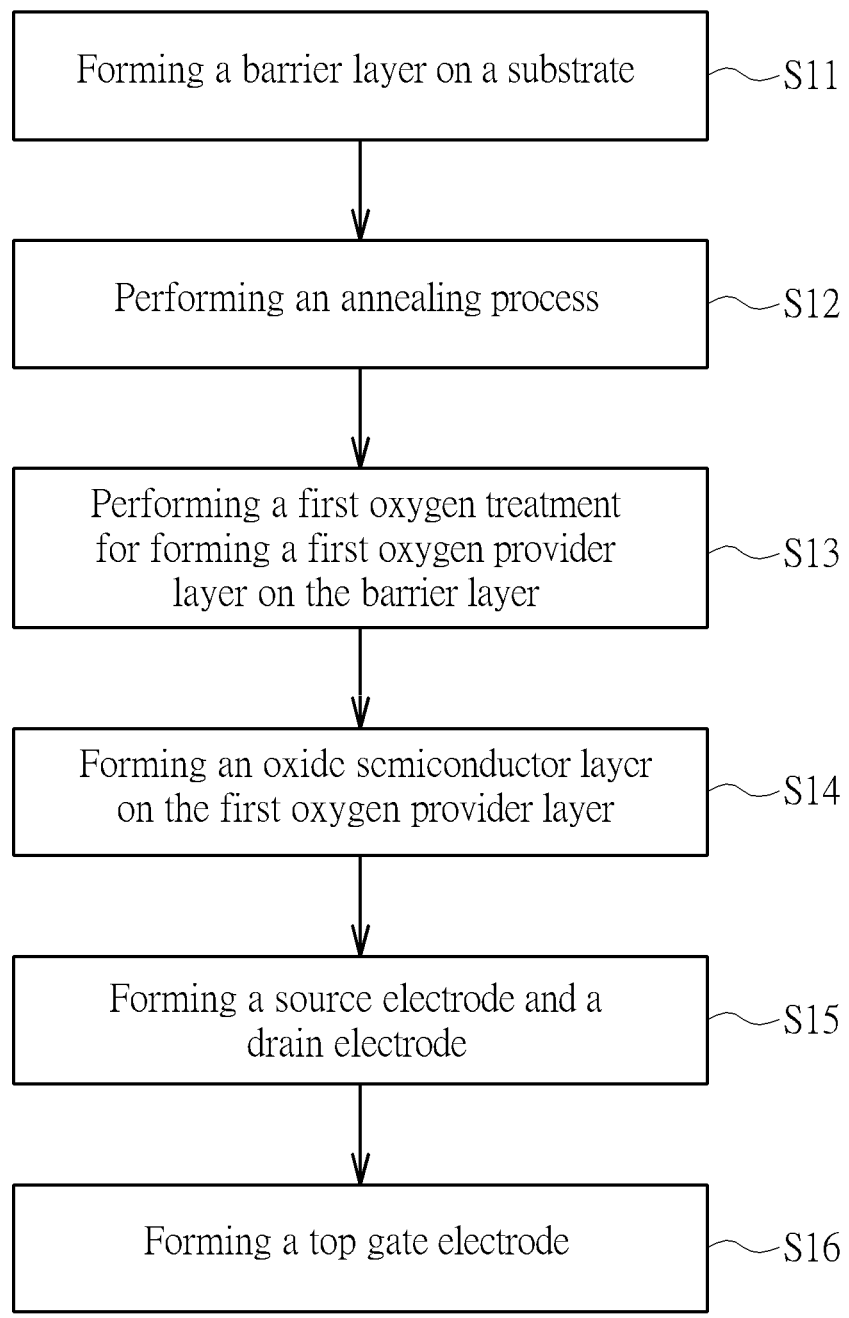
FIG. 1 is a flow chart of a manufacturing method of an oxide semiconductor device according to a first embodiment of the present invention.
Figure 2:
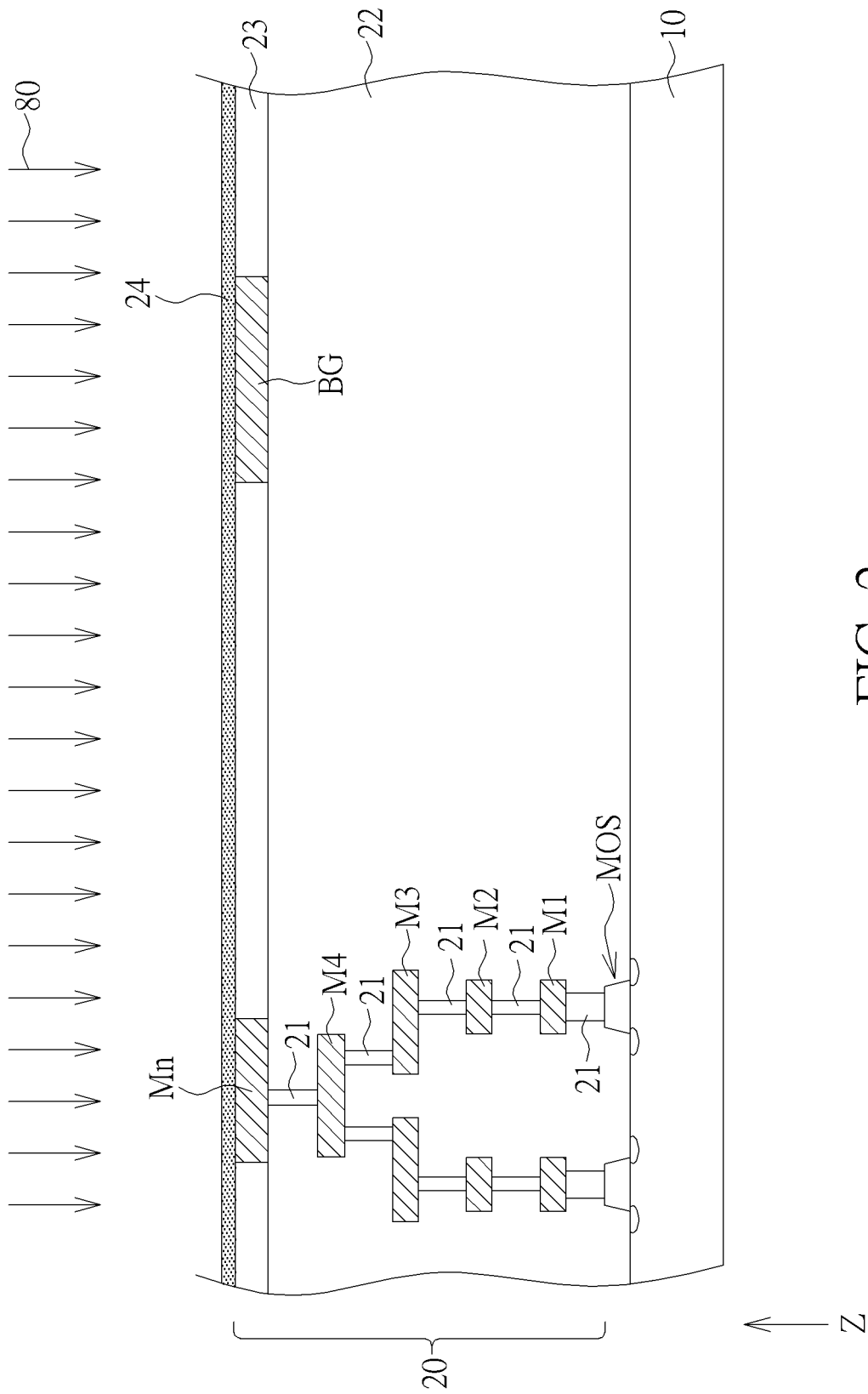

Please refer to FIGS. 1-5. FIG. 1 is a flow chart of a manufacturing method of an oxide semiconductor device according to a first embodiment of the present invention. FIGS. 2-5 are schematic drawings illustrating the manufacturing method of the oxide semiconductor device in this embodiment. The manufacturing method in this embodiment includes the following steps. As shown in FIG. 1 and FIG. 2, in step S11, a barrier layer 24 is formed on a substrate 10. The barrier layer 24 may include an oxide layer such as a silicon oxide layer or other suitable insulating materials. The substrate 10 may include a semiconductor substrate, a glass substrate, a plastic substrate, a ceramic substrate, or substrates made of other suitable materials. The semiconductor substrate mentioned above may include a silicon substrate, an epitaxial silicon substrate, a silicon germanium substrate, a silicon carbide substrate, or a silicon-on-insulator (SOI) substrate, but not limited thereto. For example, the substrate 10 in this embodiment may be a semiconductor substrate, and at least one silicon-based field effect transistor MOS may be formed on the substrate 10 before the step of forming the barrier layer 24. Specifically, a plurality of the silicon-based field effect transistors MOS, an interconnection structure 20, an inter metal dielectric (IMD) 22, and a dielectric layer 23 may be formed on the substrate before the step of forming the barrier layer 24. In other words, the barrier layer 24 is also formed on the interconnection structure 20 and the dielectric layer 23. The interconnection structure 20 may be connected to the silicon-based field effect transistors MOS and include a plurality of via plugs 21 and metal layers (such as a first metal layer M1, a second metal layer M2, a third metal layer M3, a fourth metal layer M4, and a top metal layer Mn shown in FIG. 2) alternately stacked in a vertical direction Z. In addition, a bottom gate electrode BG may be selectively formed on the substrate 10 before the step of forming the barrier layer 24, and a part of the barrier layer 24 may be formed on the bottom gate electrode BG. The bottom gate electrode BG and the top metal layer Mn may be formed by the same material and an identical process step on the inter metal dielectric 22, so as to simplify the manufacturing processes, but not limited thereto. For example, the material of the bottom gate electrode BG and the top metal layer Mn may include aluminum (Al), copper (Cu), tungsten (W), molybdenum (Mo), titanium (Ti), tantalum (Ta), or other appropriate conductive materials. Subsequently, in step S12, an annealing process 80 is performed after the step of forming the barrier layer 24. The annealing process 80 may include a flash annealing process, a laser spike annealing treatment, or other appropriate annealing processes. The annealing temperature of the annealing process 80 may range between 400° C. and 650° C. preferably, but not limited thereto.

Figure 3:
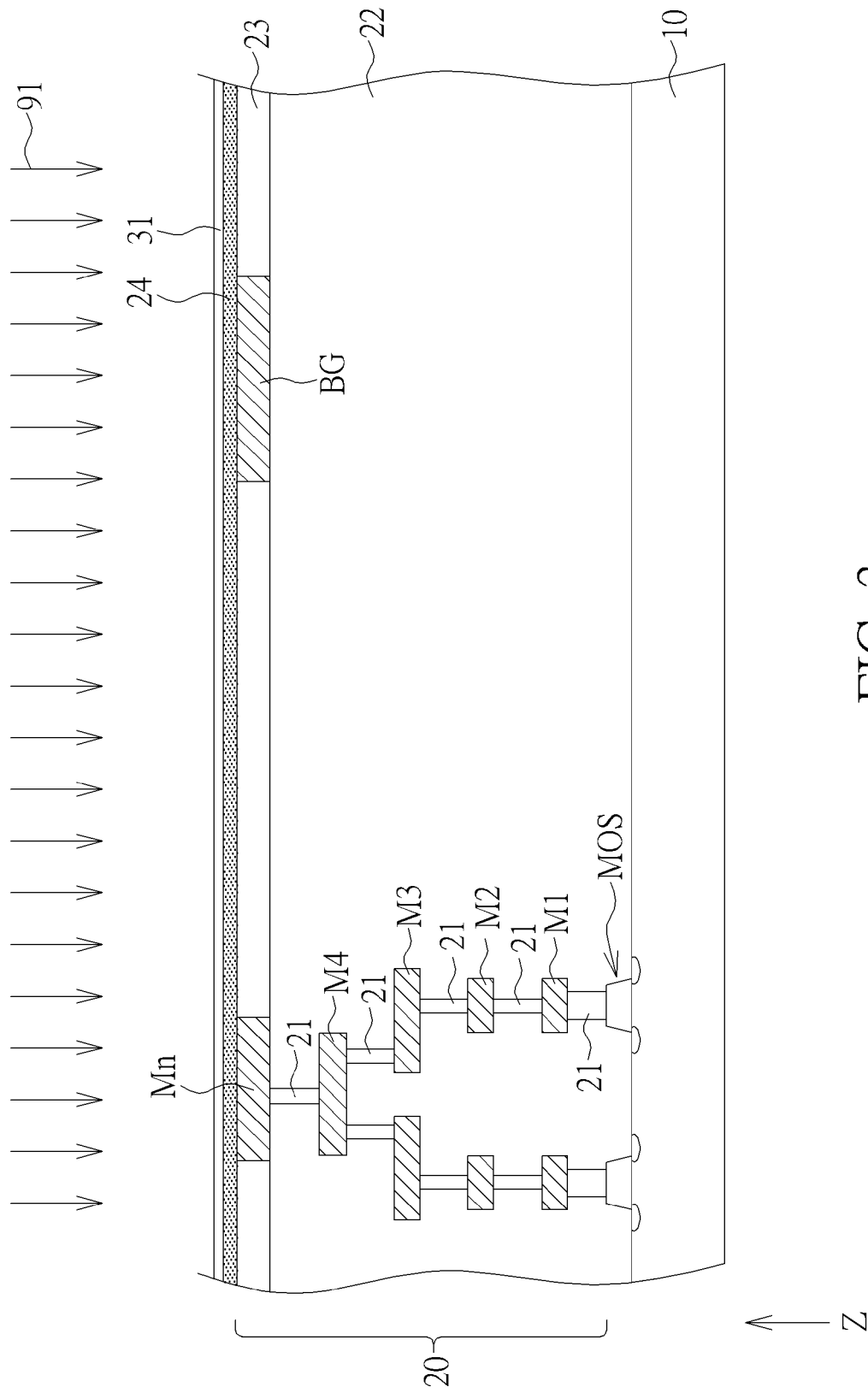

As shown in FIGS. 1-3, in step S13, a first oxygen treatment 91 is then performed on the barrier layer 24 after the annealing process 80 for forming a first oxygen provider layer 31 on the barrier layer 24. The first oxygen provider layer 31 is an oxygen-rich material layer generated by the first oxygen treatment 91 on the barrier layer 24. The first oxygen treatment 91 in this embodiment may include an oxygen plasma radical treatment, an ozone ($O_3$) oxidation treatment, an ozone cleaning treatment, or other suitable oxygen treatments.

Figure 4:
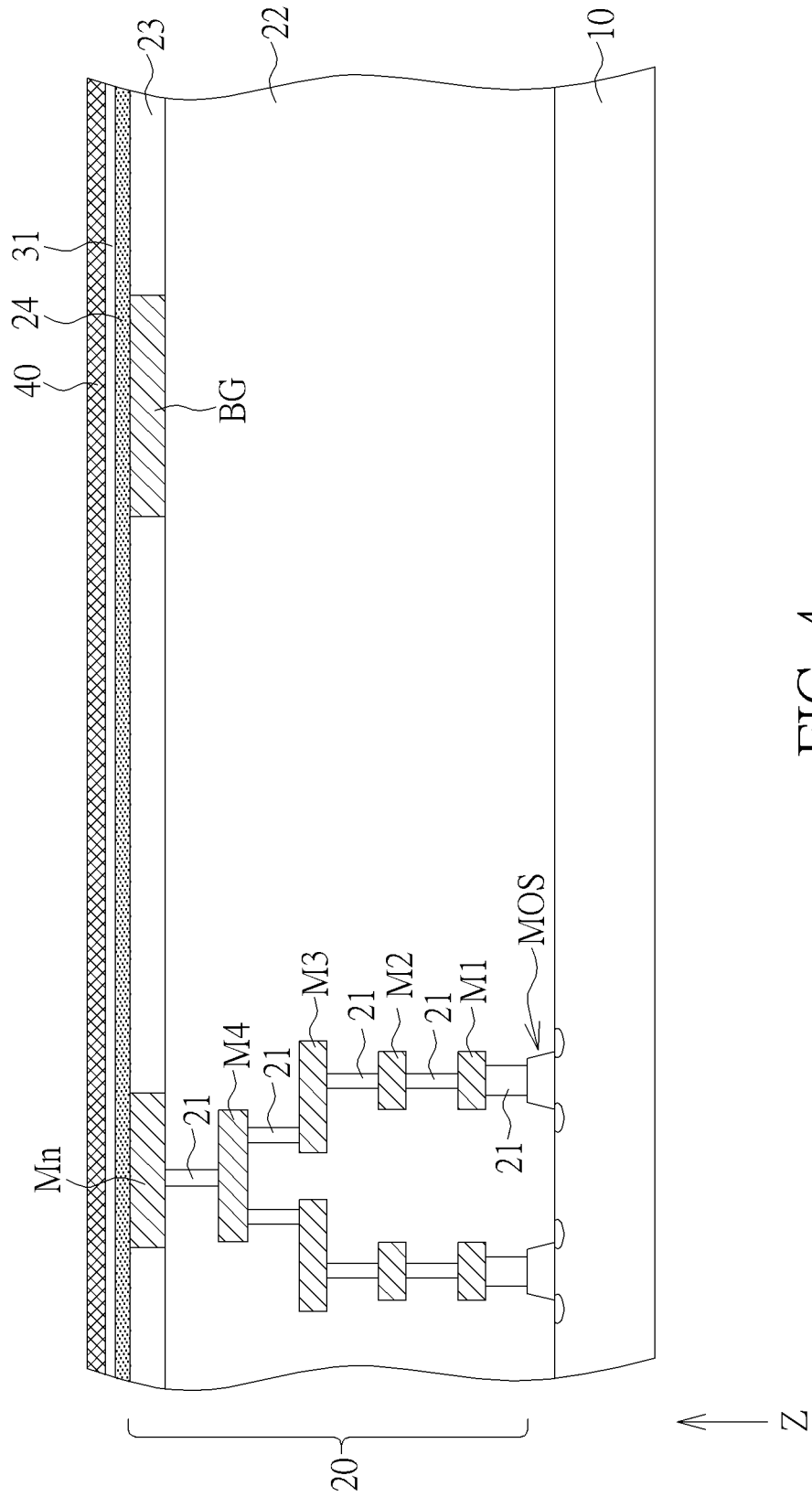

As shown in FIG. 1 and FIGS. 3-4, in step S14, an oxide semiconductor layer 40 is then formed on the first oxygen provider layer 31. In this embodiment, the oxide semiconductor layer 40 may include II-VI compounds (such as zinc oxide, ZnO), II-VI compounds doped with alkaline-earth metals (such as zinc magnesium oxide, ZnMgO), II-VI compounds doped with IIIA compounds (such as indium gallium zinc oxide, IGZO), II-VI compounds doped with VA compounds (such as stannum stibium oxide, $SnSbO_2$), II-VI compounds doped with VIA compounds (such as zinc selenium oxide, ZnSeO), II-VI compounds doped with transition metals (such as zinc zirconium oxide, ZnZrO), or other oxide semiconductor materials composed of mixtures of the above-mentioned materials, but not limited thereto. The oxide semiconductor layer 40 may be formed by a physical vapor deposition (PVD) process, a chemical vapor deposition process, or other suitable processes. In this embodiment, the oxide semiconductor layer 40 is directly formed on the first oxygen provider layer 31 and contacts the first oxygen provider layer 31. The first oxygen provider layer 31 may provide oxygen to the oxide semiconductor layer 40 and/or keep the oxygen in the oxide semiconductor layer 40 from diffusing outward. The oxygen concentration of the first oxygen provider layer 31 is higher than the oxygen concentration of the oxide semiconductor layer preferably, but not limited thereto. Accordingly, the concentration of the oxygen vacancies in the oxide semiconductor layer 40 may be controlled, and the film quality of the oxide semiconductor layer 40 may not be degraded by the ambient condition and subsequent processes. Additionally, the first oxygen treatment 91 and the step of forming the oxide semiconductor layer 40 may be in-situ process performed in an identical process chamber so as to simplify the manufacturing process and keep the interface condition between the first oxygen provider layer 31 and the oxide semiconductor layer 40 from being influenced by the environment outside the process chamber. In other words, the first oxygen treatment 91 may be performed in one process chamber, and the oxide semiconductor layer 40 may be formed right after the first oxygen treatment 91 in the same process chamber without breaking the vacuum condition preferably.

Figure 5:
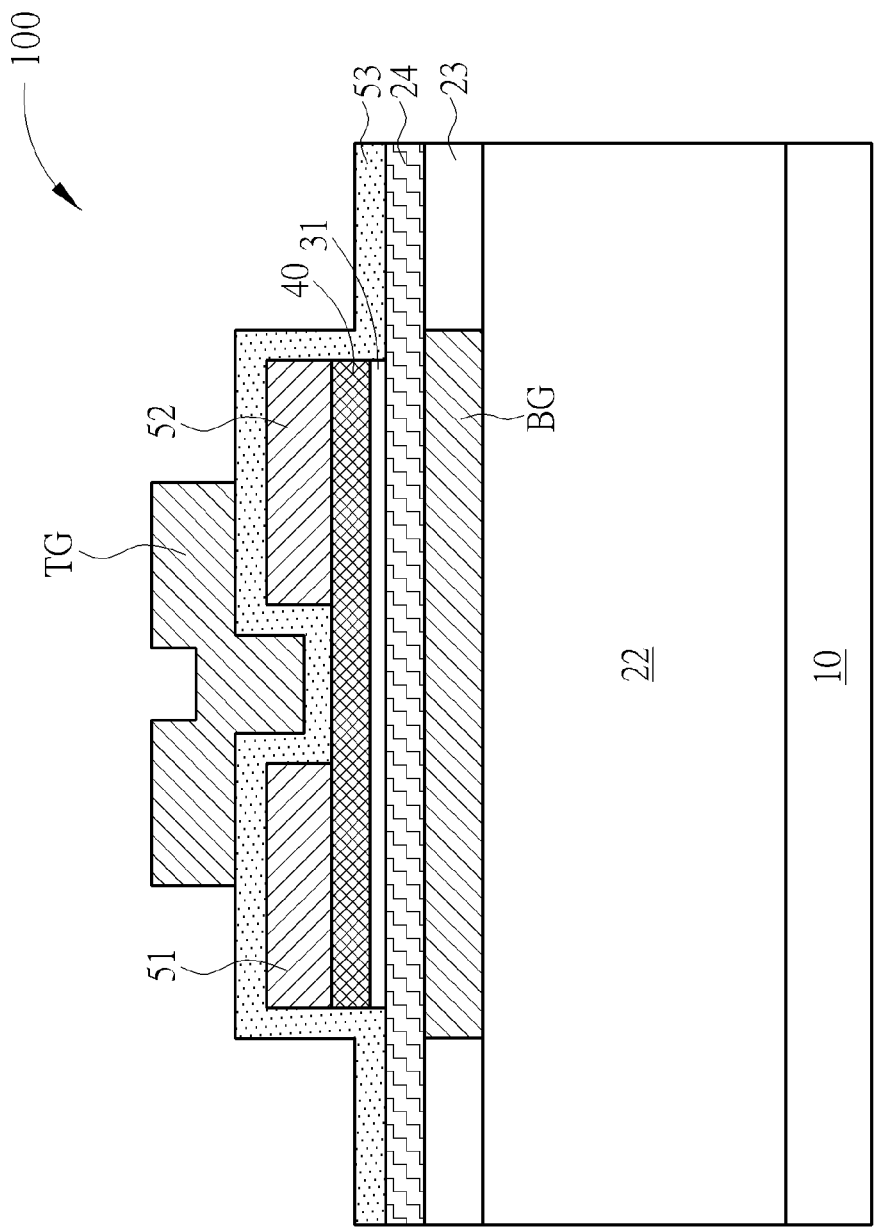

As shown in FIG. 1 and FIG. 5, in step S15, a source electrode 51 and a drain electrode 52 may be formed on the oxide semiconductor layer 40. The oxide semiconductor layer 40 and the first oxygen provider layer 31 may be patterned before or after the step of forming the source electrode 51 and the drain electrode 52. Subsequently, in step S16, a gate insulation layer 53 and a top gate electrode TG may be selectively formed above the oxide semiconductor layer 40. An oxide semiconductor device 100 as shown in FIG. 5 may be obtained by the manufacturing method described above. The oxide semiconductor device 100 may be regarded as a dual gate field effect transistor, but the present invention is not limited to this. In other embodiments of the present invention, the oxide semiconductor layer 40 and the first oxygen provider layer 31 may also be applied in a top gate field effect transistor without forming the bottom gate electrode BG or inputting driving signal to the bottom gate electrode BG. Similarly, in other embodiments of the present invention, the oxide semiconductor layer 40 and the first oxygen provider layer 31 may also be applied in a bottom gate field effect transistor without forming the top gate electrode TG or inputting driving signal to the top gate electrode TG. In other words, the oxide semiconductor layer 40 and the first oxygen provider layer 31 in this embodiment are not limited to be applied in the transistor structures described above. Other transistor structures such as an etching stop structure or a coplanar structure may also be applied in the present invention.

In this embodiment, the first oxygen provider layer 31 may be used to provide oxygen to the oxide semiconductor layer 40 when the oxygen vacancies increase in the oxygen in the oxide semiconductor layer 40, and the first oxygen provider layer 31 may also be used to keep the oxygen in the oxide semiconductor layer 40 from diffusing outward. The stability and the reliability of the oxide semiconductor device 100 in this embodiment may be enhanced because the concentration of the oxygen vacancies in the oxide semiconductor layer 40 may be controlled and the film quality of the oxide semiconductor layer 40 may not be degraded by the ambient condition and the subsequent processes.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 6:
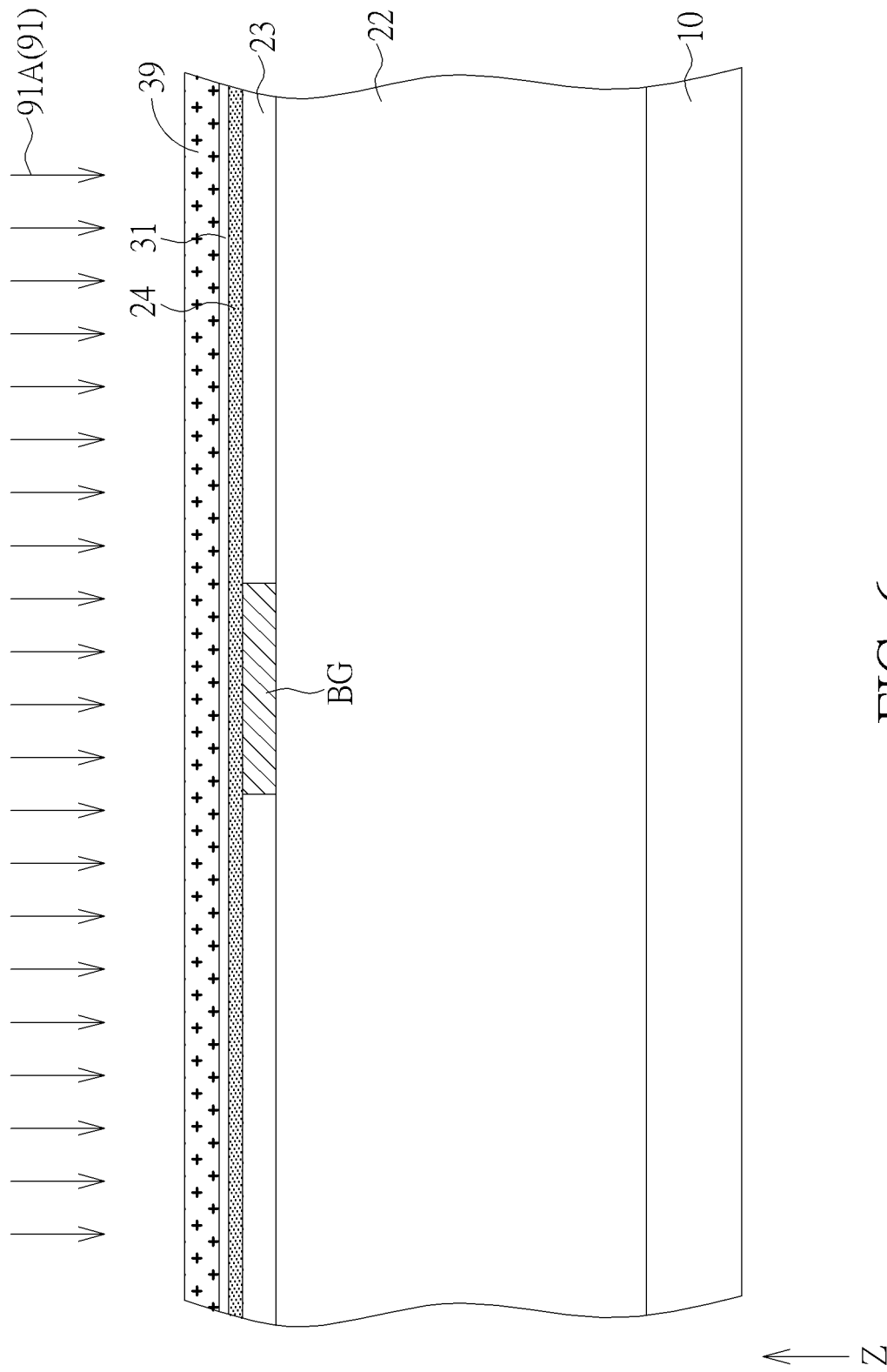
FIG. 6 is a schematic drawing illustrating a manufacturing method of an oxide semiconductor device according to a second embodiment of the present invention.

Please refer to FIG. 6. FIG. 6 is a schematic drawing illustrating a manufacturing method of an oxide semiconductor device according to a second embodiment of the present invention. As shown in FIG. 6, the difference between manufacturing method in this embodiment and the manufacturing method in the first embodiment mentioned above is that the first oxygen treatment 91 in this embodiment includes a deposition process 91A for forming an auxiliary oxide layer 39 on the barrier layer 24, and the first oxygen provider layer 31 may then be formed between the auxiliary oxide layer 39 and the barrier layer 24. The auxiliary oxide layer 39 in this embodiment may include hafnium oxide, aluminum oxide, lanthanum oxide, tantalum oxide, yttrium oxide, zirconium oxide, or other suitable oxide materials which tend to form an oxide provider layer at the interface between the auxiliary oxide layer 39 and the barrier layer 24. The auxiliary oxide layer 39 in this embodiment may be removed after the first oxygen provider layer 31 is formed and before the step of forming the oxide semiconductor layer (similar to the conditions of FIG. 3 and FIG. 4 described above).

Figure 7:
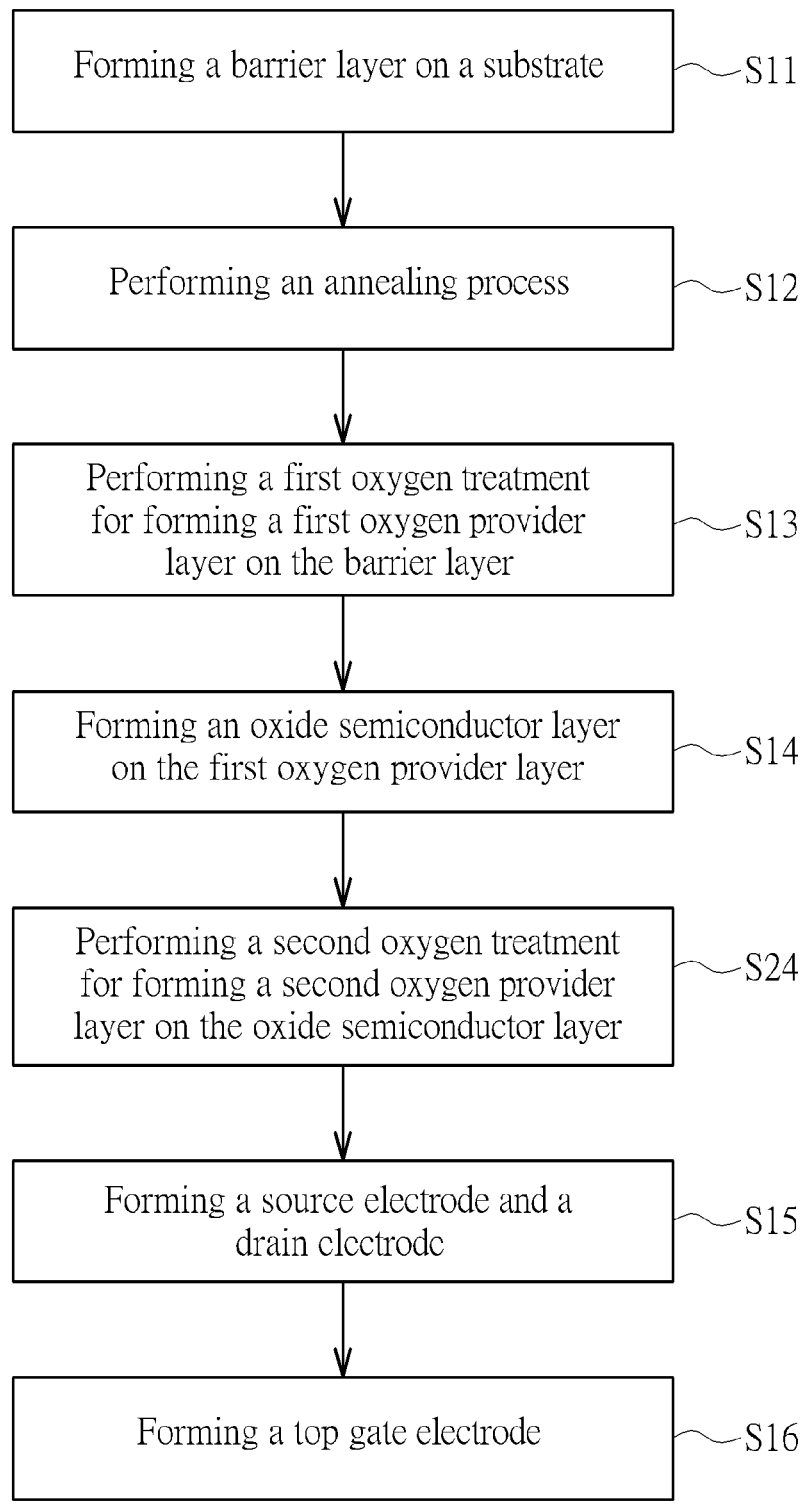
FIG. 7 is a flow chart of a manufacturing method of an oxide semiconductor device according to a third embodiment of the present invention.
Figure 8:
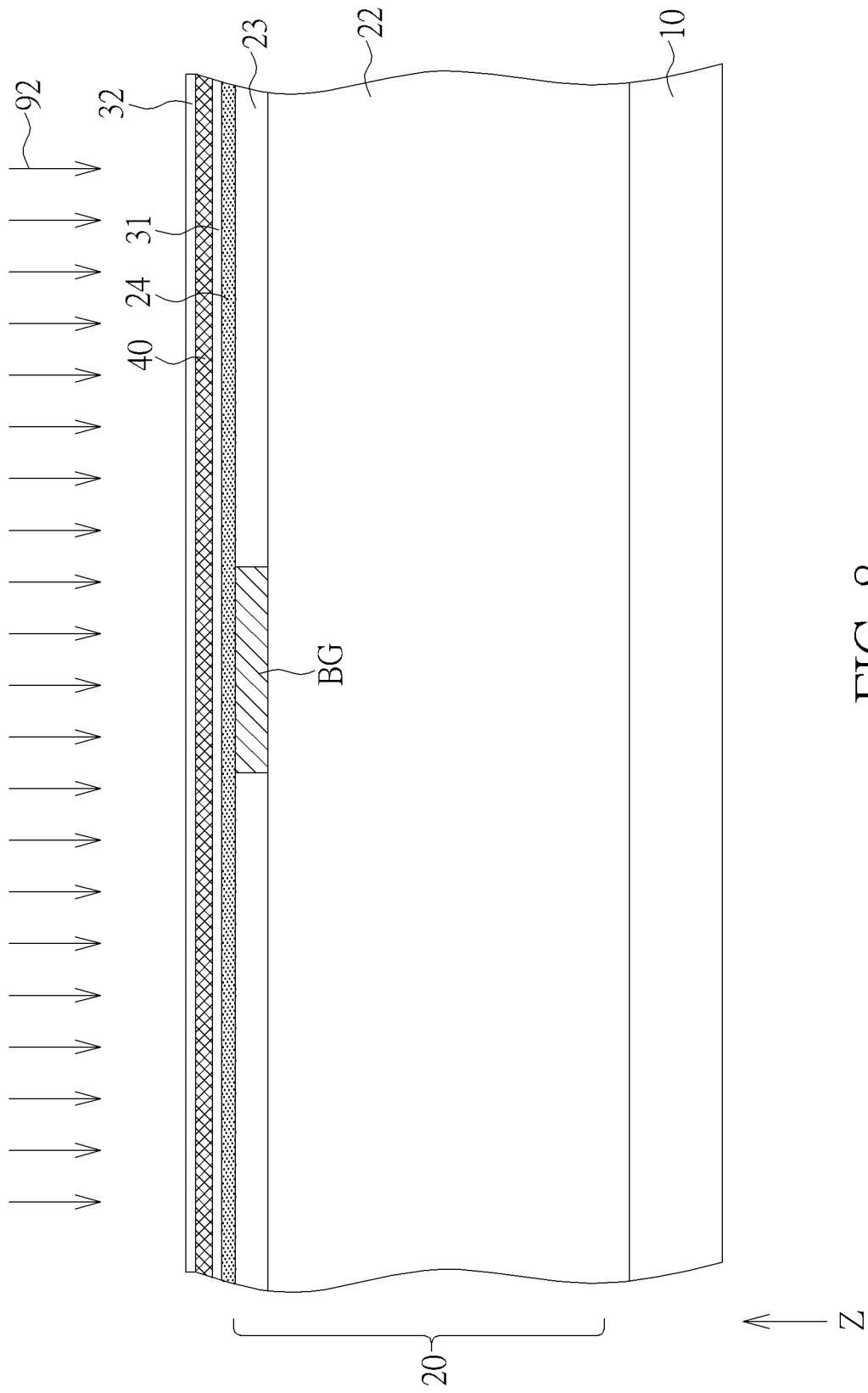
Figure 9:
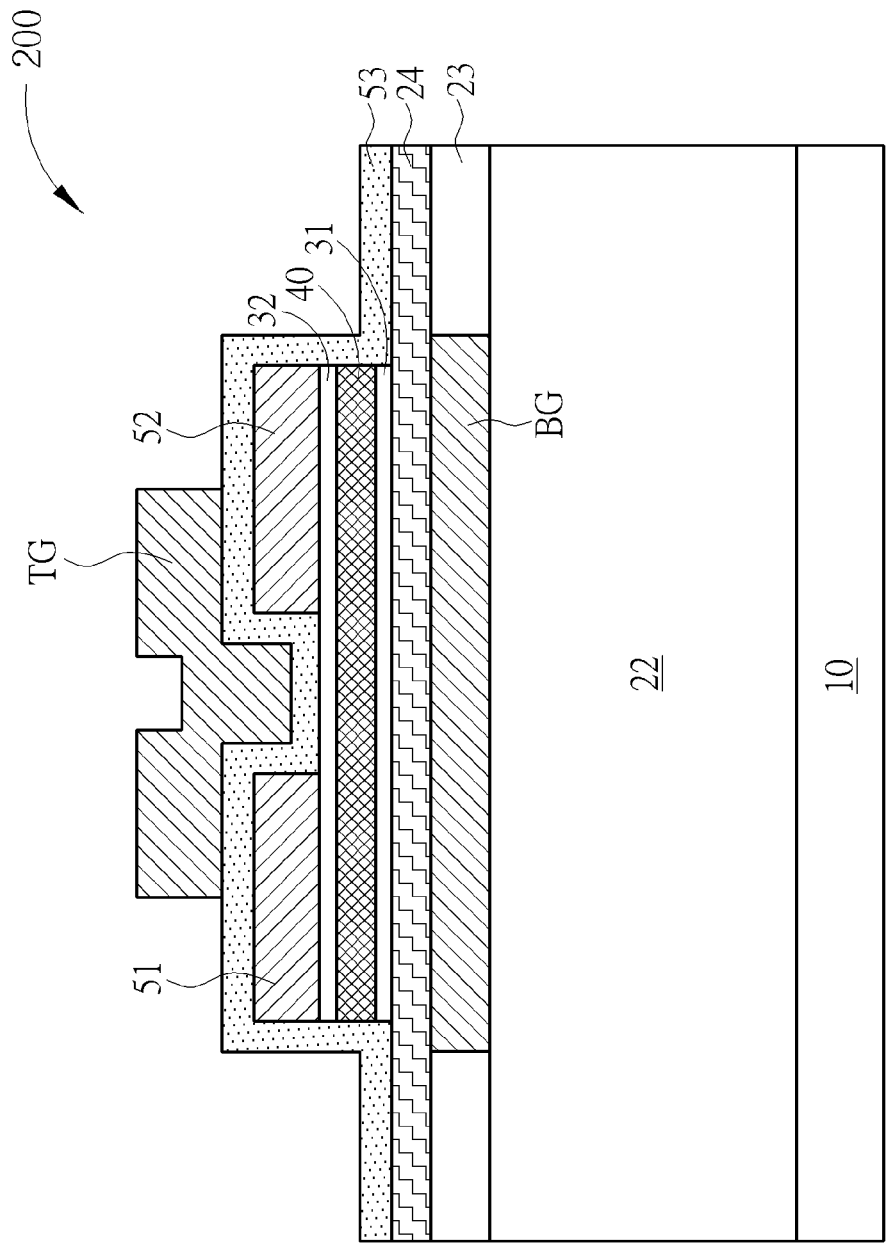

Please refer to FIGS. 7-9. FIG. 7 is a flow chart of a manufacturing method of an oxide semiconductor device according to a third embodiment of the present invention. FIG. 8 and FIG. 9 are schematic drawings illustrating the manufacturing method of the oxide semiconductor device in this embodiment. As shown in FIG. 7 and FIG. 8, the manufacturing method in this embodiment further includes step S24 after the step S14 and before the step S15 described in the first embodiment. In this embodiment, a second oxygen treatment 92 is performed after the step of forming the oxide semiconductor layer 40. A second oxygen provider layer 32 is formed on the oxide semiconductor layer 40 by the second oxygen treatment 92. The second oxygen provider layer 32 is an oxygen-rich material layer generated by the second oxygen treatment 92 on the oxide semiconductor layer 40. The oxygen concentration of the second oxygen provider layer 32 is higher than the oxygen concentration of the oxide semiconductor layer 40 preferably, but not limited thereto. The second oxygen treatment 92 in this embodiment may include an oxygen plasma radical treatment, an ozone oxidation treatment, an ozone cleaning treatment, or other suitable oxygen treatments.

In this embodiment, the second oxygen provider layer 32 is directly formed on the oxide semiconductor layer 40 and contacts the oxide semiconductor layer 40. The second oxygen provider layer 32 may also provide oxygen to the oxide semiconductor layer 40 and/or keep the oxygen in the oxide semiconductor layer 40 from diffusing outward. In other words, the oxide semiconductor layer 40 may be sandwiched by the first oxygen provider layer 31 and the second oxygen provider layer 32, and the sealing effect and oxygen providing performance in this embodiment may be further improved accordingly. Additionally, the first oxygen treatment 91, the step of forming the oxide semiconductor layer 40, and the second oxygen treatment 92 may be in-situ process performed in an identical process chamber so as to simplify the manufacturing process and keep the interface conditions between the first oxygen provider layer 31 and the oxide semiconductor layer 40 and between the oxide semiconductor layer 40 and the second oxygen provider layer 32 from being influenced by the environment outside the process chamber. In other words, the first oxygen treatment 91 may be performed in one process chamber, the oxide semiconductor layer 40 may be formed right after the first oxygen treatment 91 in the same process chamber without breaking the vacuum condition, and the second oxygen treatment 92 may be performed right after the step of forming the oxide semiconductor layer 40 in the same process chamber without breaking the vacuum condition.

As shown in FIG. 9, the source electrode 51 and the drain electrode 52 may be formed on the second oxygen provider layer 32. The first oxygen provider layer 31, the oxide semiconductor layer 40, and the second oxygen provider layer 32 may be patterned before or after the step of forming the source electrode 51 and the drain electrode 52. Additionally, the gate insulation layer 53 and the top gate electrode TG may be selectively formed above the oxide semiconductor layer 40, and an oxide semiconductor device 200 as shown in FIG. 9 may be obtained by the manufacturing method described above.

In this embodiment, the oxide semiconductor layer 40 is sandwiched between the first oxygen provider layer 31 and the second oxygen provider layer 32. The first oxygen provider layer 31 and the second oxygen provider layer 32 may be used to provide oxygen to the oxide semiconductor layer 40 when the oxygen vacancies increase in the oxygen in the oxide semiconductor layer 40. The first oxygen provider layer 31 and the second oxygen provider layer 32 may also be used to keep the oxygen in the oxide semiconductor layer 40 from diffusing outward. The stability and the reliability of the oxide semiconductor device 200 in this embodiment may be further enhanced accordingly.

To summarize the above descriptions, in the manufacturing method of the oxide semiconductor device of the present invention, the first oxygen provider layer under the oxide semiconductor layer and the second oxygen provider layer above the oxide semiconductor layer may be used to provide oxygen to the oxide semiconductor layer when the oxygen vacancies increase in the oxygen in the oxide semiconductor layer because the oxygen in the oxide semiconductor layer diffuses outward in the subsequent processes. Additionally, the first oxygen provider layer and the second oxygen provider layer may also be used to seal the oxygen in the oxide semiconductor layer. The oxide semiconductor layer in the present invention may be kept from being degraded by the ambient condition and the subsequent processes. The stability and reliability of the oxide semiconductor device may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of an oxide semiconductor device, comprising:
    forming a barrier layer on a substrate;
    performing an annealing process after the step of forming the barrier layer;
    performing a first oxygen treatment on the barrier layer after the annealing process
    for forming a first oxygen provider layer on the barrier layer, wherein the first oxygen treatment comprises an ozone cleaning treatment; and
    forming an oxide semiconductor layer on the first oxygen provider layer.

2. The manufacturing method of claim 1, further comprising:
    performing a second oxygen treatment after the step of forming the oxide semiconductor layer, wherein a second oxygen provider layer is formed on the oxide semiconductor layer by the second oxygen treatment.

3. The manufacturing method of claim 2, wherein the second oxygen treatment comprises an oxygen plasma radical treatment or an ozone oxidation treatment.

4. The manufacturing method of claim 1, further comprising:
    forming at least one silicon-based field effect transistor on the substrate before the step of forming the barrier layer.

5. The manufacturing method of claim 1, further comprising:
    forming a bottom gate electrode on the substrate before the step of forming the barrier layer, wherein a part of the barrier layer is formed on the bottom gate electrode.

6. The manufacturing method of claim 1, further comprising:
    forming a top gate electrode above the oxide semiconductor layer.

7. A manufacturing method of an oxide semiconductor device, comprising:
    forming a barrier layer on a substrate;
    performing an annealing process after the step of forming the barrier layer;
    performing a first oxygen treatment on the barrier layer after the annealing process for forming a first oxygen provider layer on the barrier layer;
    forming an oxide semiconductor layer on the first oxygen provider layer; and
    performing a second oxygen treatment after the step of forming the oxide semiconductor layer, wherein a second oxygen provider layer is formed on the oxide semiconductor layer by the second oxygen treatment.

8. The manufacturing method of claim 7, wherein the first oxygen treatment comprises at least one of an oxygen plasma radical treatment, an ozone oxidation treatment, or an ozone cleaning treatment.

9. The manufacturing method of claim 7, wherein the first oxygen treatment comprises:
   forming an auxiliary oxide layer on the barrier layer;
   forming the first oxygen provider layer between the auxiliary oxide layer and the barrier layer; and
   removing the auxiliary oxide layer after the first oxygen provider layer is formed and before the step of forming the oxide semiconductor layer.

10. The manufacturing method of claim 7, wherein the second oxygen treatment comprises an oxygen plasma radical treatment or an ozone oxidation treatment.

11. The manufacturing method of claim 7, wherein the first oxygen treatment, the step of forming the oxide semiconductor layer, and the second oxygen treatment are in-situ process performed in an identical process chamber.

12. The manufacturing method of claim 7, further comprising:
   forming at least one silicon-based field effect transistor on the substrate before the step of forming the barrier layer.

* * * * *